United States Patent
Yim et al.

(10) Patent No.: US 9,165,998 B2
(45) Date of Patent: Oct. 20, 2015

(54) ADHESION LAYER TO MINIMIZE DIELECTRIC CONSTANT INCREASE WITH GOOD ADHESION STRENGTH IN A PECVD PROCESS

(71) Applicant: Applied Materials, Inc., Santa Clara, CA (US)

(72) Inventors: Kang Sub Yim, Palo Alto, CA (US); Pendar Ardalan, Palo Alto, CA (US); Sure Ngo, Dublin, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/213,038

(22) Filed: Mar. 14, 2014

(65) Prior Publication Data

US 2014/0264780 A1    Sep. 18, 2014

Related U.S. Application Data (60) Provisional application No. 61/784,472, filed on Mar. 14, 2013.

(51) Int. Cl.
| | |
|---|---|
| H01L 21/31 | (2006.01) |
| H01L 29/06 | (2006.01) |
| H01L 21/02 | (2006.01) |
| C23C 16/40 | (2006.01) |
| C23C 16/455 | (2006.01) |
| C23C 16/505 | (2006.01) |
| H01L 21/768 | (2006.01) |

(52) U.S. Cl.
CPC .............. *H01L 29/06* (2013.01); *C23C 16/401* (2013.01); *C23C 16/45512* (2013.01); *C23C 16/45561* (2013.01); *C23C 16/505* (2013.01); *H01L 21/02126* (2013.01); *H01L 21/02203* (2013.01); *H01L 21/02216* (2013.01); *H01L 21/02274* (2013.01); *H01L 21/02304* (2013.01); *H01L 21/7682* (2013.01); *H01L 21/76829* (2013.01); *H01L 2221/1047* (2013.01)

(58) Field of Classification Search
CPC ................... H01L 21/02126; H01L 21/02203; H01L 21/02211; H01L 21/02304
USPC ................... 438/287, 624, 763, 784; 257/760
See application file for complete search history.

(56) References Cited

U.S. PATENT DOCUMENTS

| | | | |
|---|---|---|---|
| 7,297,376 B1 * | 11/2007 | Yim et al. ..................... | 427/578 |
| 2003/0017642 A1 * | 1/2003 | Conti et al. ..................... | 438/99 |
| 2005/0233591 A1 * | 10/2005 | Schmitt et al. ................. | 438/706 |
| 2006/0160376 A1 * | 7/2006 | Padhi et al. .................... | 438/789 |
| 2007/0093078 A1 * | 4/2007 | Harada et al. ................. | 438/790 |
| 2007/0190784 A1 * | 8/2007 | Cui et al. ..................... | 438/687 |
| 2007/0249159 A1 * | 10/2007 | Tsai et al. ..................... | 438/637 |
| 2008/0233366 A1 * | 9/2008 | Edelstein et al. ............. | 428/201 |
| 2010/0015816 A1 * | 1/2010 | Chan et al. .................... | 438/778 |
| 2011/0104866 A1 * | 5/2011 | Ruelke et al. ................. | 438/421 |

(Continued)

*Primary Examiner* — George Fourson, III
(74) *Attorney, Agent, or Firm* — Patterson & Sheridan, LLP (57) ABSTRACT

Embodiments of the present invention provide a film stack and method for depositing an adhesive layer for a low dielectric constant bulk layer without the need for an initiation layer. A film stack for use in a semiconductor device comprises of a dual layer low-K dielectric deposited directly on an underlying layer. The dual low-K dielectric consists of an adhesive layer deposited without a carbon free initiation layer.

18 Claims, 3 Drawing Sheets

(56) References Cited

U.S. PATENT DOCUMENTS

| | | | |
|---|---|---|---|
| 2011/0183526 A1* | 7/2011 | Yamamoto et al. | 438/778 |
| 2011/0204382 A1* | 8/2011 | Traut et al. | 257/77 |
| 2012/0121823 A1* | 5/2012 | Chhabra et al. | 427/585 |
| 2014/0264780 A1* | 9/2014 | Yim et al. | 257/632 |

* cited by examiner

FIG. 1

(PRIOR ART)

ADHESION LAYER TO MINIMIZE DIELECTRIC CONSTANT INCREASE WITH GOOD ADHESION STRENGTH IN A PECVD PROCESS

CROSS-REFERENCE TO RELATED APPLICATIONS

This application claims benefit of U.S. Provisional Application Ser. No. 61/784,472, filed Mar. 14, 2013, of which is incorporated by reference in its entirety.

BACKGROUND OF THE INVENTION

1. Field of the Invention

The present invention relates to the fabrication of integrated circuits. More particularly, the invention relates to a process for depositing dielectric layers on a substrate.

2. Background of the Invention

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide". Plasma-enhanced CVD techniques promote excitation and/or disassociation of the reactant gases by the application of energy, commonly radio frequency (RF) energy, to a reaction zone near the substrate surface, thereby creating plasma of highly reactive species. The high reactivity of the species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's semiconductor manufacturing facilities currently produce devices having even smaller geometries.

As devices geometries become smaller, liner layers and capping layers having relatively high dielectric constants contribute more to the overall dielectric constant of a multi-component dielectric layer. Additionally, the smaller device geometries result in an increase in parasitic capacitance between devices. Parasitic capacitance between metal interconnects on the same or adjacent layers on a device can result in crosstalk between the metal lines or interconnects and/or create resistance-capacitance (RC) delay, thereby reducing the response time of the device and degrading the overall performance of the device. The effects of parasitic capacitance between metal interconnects on the same or adjacent layers in the circuit is especially of concern as the current state of the art circuits can employ 4 to 5 levels of interconnection, while advanced devices require 6, 7, or possibly 8 levels of interconnection.

Lowering the parasitic capacitance between metal interconnects separated by dielectric material can be accomplished by increasing the thickness of the dielectric material, by lowering the dielectric constant of the dielectric material, or both. Increasing the thickness of the dielectric materials, however, does not address parasitic capacitance within the same metalized layer or plane. As a result, to reduce the parasitic capacitance between metal interconnects on the same or adjacent layers, one must change the material used between the metal lines or interconnects to a material having a lower dielectric constant than that of the materials currently used, i.e., $K \approx 3.0$.

Therefore, as the size of the semiconductor devices are reduced, an ultra low-K dielectric material is required for the interconnect structure. One integration challenge has been the adhesion strength between low-K dielectric materials and surface on which they are formed. Bad adhesion can cause several reliability issues, including electro migration (EM) failure, chip package interaction (CPI) failure, etc. One solution used to improve the adhesion of the low-K dielectric material is to implement an adhesion layer before the main bulk film deposition of the low or ultra K layer.

Figure 1:
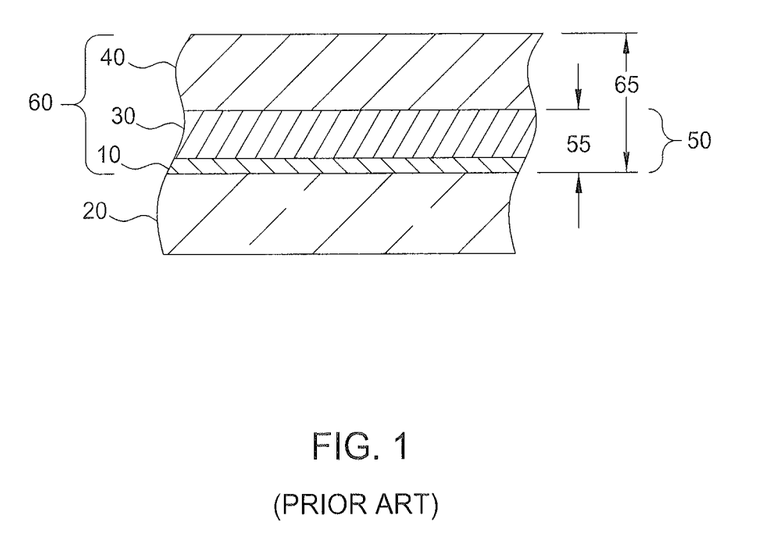
FIG. 1 is a schematic diagram of a conventional low-K dielectric layer deposited on a substrate by the processes known in the art.

FIG. 1 illustrates a schematic diagram of a conventional low-K dielectric layer deposited on a substrate by the processes known in the art. The diagram shows an adhesive layer 50 disposed on an underlying layer 20. The adhesive layer 50 provides a bond between the bulk layer 40 and the underlying layer 20. The adhesion layer 50 is composed of a carbon-free oxide initiation layer 10 followed by a transition layer 30 with increasing carbon content steadily between the initiation layer 10 and bulk layer 40. However, if the thickness 55 of an adhesion layer 50 is too great, it will cause an unacceptable increase in the K value, especially at advanced node (<20 nm).

Referring to FIG. 1, the PECVD initiation layer 10 is deposited by the plasma enhanced reaction of a film containing carbon free silicon and oxide, one such compound is silica (SiO2). A transition or graded layer 30 is then deposited on the initiation layer 10 by the plasma enhanced reaction of gases containing silicon, carbon and oxygen, and the concentration of the carbon containing gas is increased as a carbon doped film layer is formed to the full thickness 55 of the adhesion layer 50. The full thickness 55 of the adhesion layer 50 is approximately greater than 350 Å (angstroms×$10^{-10}$). A four point bending technique is used to measure fracture energy by applying a crack driving "force" that is higher than the cracking "resistance" of the weakest layer in the thin film stack. The fracture energy measured for the conventional low-K dielectric layer deposited on the substrate of FIG. 1 is approximately 6.2 J/m². This fracture energy indicates a good adhesion but the adhesion layer 50 has a large thickness without even considering the remaining thickness of the low-K dielectric layer.

The key for successful low-K integration is to maintain a strong adhesion while maintaining a minimum thickness 55 of the adhesion layer 50 at the advanced node. Therefore, there remains a need for thin dielectric layers (<150 Å) having dielectric constants below 2.5 that also have good adhesion properties.

SUMMARY OF THE INVENTION

Embodiments of the present invention provide a film stack and method for depositing a thin adhesive layer for a low dielectric constant bulk layer without an initiation layer. A film stack for use in a semiconductor device comprises of a dual layer low-K dielectric deposited directly on an underlying layer. The dual low-K dielectric consists of an adhesive layer developed without a carbon free initiation layer and a bulk layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

One embodiment of the invention provides methods for fabricating a dual layer nano-porous low-K dielectric consisting of an adhesive and a bulk layer suited for Dual-Damascene processes. The adhesive layer herein does not require an initiation layer. A chemical vapor deposition chamber deposits, as a thin film layer, the adhesive layer comprised of silicon with increasing carbon content as the adhesive layer builds up to a bulk layer. The bulk layer is a low-K dielectric material suitable for advance node and Dual-Damascene processes.

Advantageously, the method for a dual layer low-K dielectric provides an adhesive layer that is less than <50 Å thick. This is only 14% the thickness of a conventional adhesive layer which has a thickness on the order of greater than 350 Å. The adhesive layer provides an adhesive strength of 6.3 J/m² for a low-K dielectric layer which is on the order of and slightly greater than, conventional adhesive layer adhesion strength of 6.2 J/m². The low-K dielectric requires fewer process steps and less CVD operations to deposit. Thus, smaller and stronger chips can be manufactured, fewer raw materials are consumed, quicker production times are achieved, and more substrates can processed prior to routine maintenance of the CVD chambers.

The adhesive and the bulk (low-K) layers are a silicon-carbon oxygen material deposited by reacting a silicon rich precursor and a carbon rich precursor with oxidizing gas. The oxidizing gases are oxygen ($O_2$) or oxygen containing compounds such as nitrous oxide ($N_2O$), ozone ($O_3$), and carbon dioxide ($CO_2$), preferably $N_2O$ or $O_2$. The amount of carbon content in the deposition film is incrementally increased for the adhesive layer and is constant for the bulk layer. After the silicon containing material is deposited as a film, the film may be annealed at a gradually increasing temperature to convert the labile organic groups to dispersed gas pockets in a nano-porous silicon oxide layer having a low dielectric constant attributed to a closed cell foam structure.

In addition to adjusting the flow of a carbon containing precursor, oxygen and oxygen containing compounds can be dissociated to increase reactivity when necessary to achieve desired carbon content in the deposited film. Deposition of the adhesive and bulk layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited film.

Figure 2:
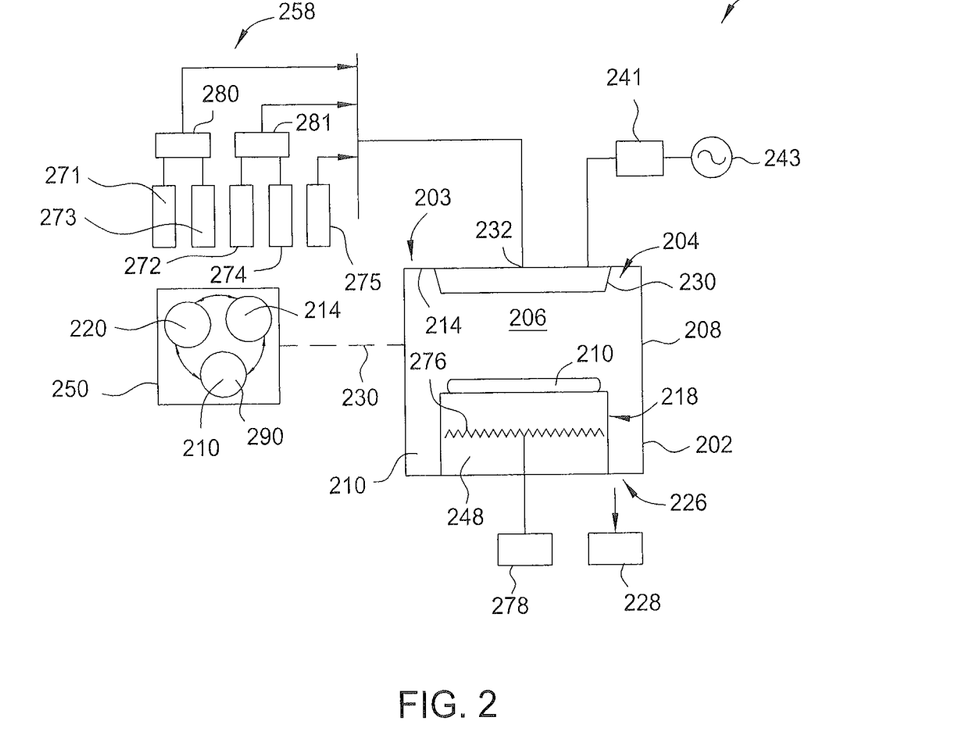
FIG. 2 is a cross-sectional diagram of an exemplary CVD reactor configured for depositing a low-K dielectric layer, according to one embodiment of the present invention.

FIG. 2 is a sectional view of one embodiment of a deposition system 200 suitable for depositing an amorphous carbon layer using an RF bias power. A suitable processing chamber 203, which may be adapted for use with the teachings disclosed herein, includes, for example, the Producer Processing system available from Applied Materials, Inc. of Santa Clara, Calif. Although the processing chamber 203 is shown including a plurality of features that enable a carbon layer deposition process using RF bias power, it is contemplated that other processing chambers may be adapted to benefit from one or more of the features disclosed herein.

The processing chamber 203 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and selectively sealed by a slit valve to facilitate entry and egress of a substrate 201 from the processing chamber 203. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 203. In one embodiment, the pump system 228 maintains the pressure inside the interior volume 206 at operating pressures typically between about 10 mTorr to about 20 Torr.

The lid 204 is sealed with, and supported on, the sidewall 208 of the chamber body 202. The lid 204 may be opened to allow access to the interior volume 206 of the processing chamber 203. The lid 204 includes a window (not shown) that facilitates optical process monitoring.

A gas panel 258 is coupled to the processing chamber 203 to provide process and/or cleaning gases to the interior volume 206 of the processing chamber 203. The gas panel 258 contains a source for a silicon precursor 271 and a carrier gas source 273 combining in a vaporizer 280 as well as a source for a carbon precursor 272 and a carrier gas source 273 combining in vaporizer 281. The compounds are mixed with an oxygen source 275 prior to entering the processing chamber 203. In the embodiment depicted in FIG. 2, inlet ports 232 is provided in the lid 204 to allow gases to be delivered from the gas panel 258 to the interior volume 206 of the processing chamber 203. Various control features of the gas panel 258 have been omitted for brevity.

A showerhead assembly 230 is coupled to an interior surface 214 of the lid 204. The showerhead assembly 230 includes a plurality of apertures that allow gases to flow through the showerhead assembly 230 from the inlet port 232 into the interior volume 206 of the processing chamber 203 in a predefined distribution across the surface of the substrate support pedestal 248.

An RF source power 243 is coupled through a matching network 241 to the showerhead assembly 230. The RF source power 243 is capable of generating up to about 3000 W at a tunable frequency in a range from about 50 kHz to about 13.56 MHz.

In one embodiment, the showerhead assembly 230 is configured with a plurality of zones (not shown) that allow for separate control of gas flowing into the interior volume 206 of the processing chamber 203. In one embodiment the showerhead assembly 230 has an inner zone and an outer zone that are separately coupled to the gas panel 258 through separate inlet ports 232.

The substrate support pedestal 248 is disposed in the interior volume 206 of the processing chamber 203 facing the gas distribution showerhead assembly 230. The substrate support pedestal 248 holds the substrate 201 during processing. The substrate support pedestal 248 generally includes a plurality of lift pins (not shown) disposed there which are configured to lift the substrate 201 from the substrate support pedestal 248 and facilitate exchange of the substrate 201 with a robot (not shown) in a conventional manner. An inner liner 218 may closely circumscribe the periphery of the substrate support pedestal 248.

The substrate support pedestal 248 may include at least one optional embedded heater 276, to control the lateral temperature profile of the substrate support pedestal 248. The heater 276 is regulated by a power source 278. In operation, the backside gas is provided at controlled pressure into the gas passages to enhance the heat transfer between the electrostatic chuck (Not shown) and the substrate support pedestal 248.

In one mode of operation, the substrate 201 is disposed on the substrate support pedestal 248 in the plasma processing chamber 203. A process gas and/or gas mixture is introduced into the chamber body 202 through the showerhead assembly 230 from the gas panel 258. A vacuum pumping system 228 maintains the pressure inside the chamber body 202 while removing deposition by-products. The vacuum pumping system 228 typically maintains an operating pressure between about 10 mTorr to about 20 Torr.

The RF source power 243 provides RF source to form the plasma and excite the gas mixture in the chamber body 202 into ions to perform a plasma process, in this example, a deposition process.

The above-described method can be implemented in a system that is controlled by a processor based system controller such as the controller 250. The system controller 250 includes a programmable central processing unit (CPU) 220 that is operable with a memory 210, a mass storage device, an input control unit, and a display unit. The system controller further includes well-known support circuits 213 such as power supplies, clocks, cache, input/output (I/O) circuits, and the like, coupled to the various components of the processing chamber 203 to facilitate control of the deposition process. The system controller 250 also includes hardware for monitoring substrate processing through sensors (not shown) in the processing chamber 203. Such sensors measure system parameters such as substrate 201 temperature, chamber atmosphere pressure and the like. All of the above elements are coupled to a control system bus.

To facilitate control of the processing chamber 203 and the gas panel 258, as described above, the CPU 220 may be one of any form of general purpose computer processor that can be used in an industrial setting, such as a programmable logic controller (PLC), for controlling various chambers and sub-processors. The memory 210 is coupled to the CPU 220, and is accessible to the system bus. The memory 210 is non-transitory and may be one or more of readily available memory such as random access memory (RAM), read only memory (ROM), floppy disk drive, hard disk, or any other form of digital storage, local or remote. The support circuits 213 are coupled to the CPU 220 for supporting the processor in a conventional manner. The deposition process is generally stored in the memory 210, typically as a software routine. The software routine may also be stored and/or executed by a second CPU (not shown) that is remotely located from the hardware being controlled by the CPU 220.

The memory 210 contains instructions that the CPU 220 executes to facilitate the operation of the processing system 200. The instructions in the memory 210 are in the form of program code such as a program that implements the method of the present invention. The program code may conform to any one of a number of different programming languages. For example, the program code can be written in C, C++, BASIC, Pascal, or a number of other languages and stored in the non-transitory memory. In one embodiment of the invention, program code controls the mixing of a silicon precursor 271 and a carrier gas source 273 as well as a carbon precursor 272 and a carrier gas source 273 with an oxygen source 275.

The input control unit couples a data input device, such as a keyboard, mouse, or light pen, to the CPU 220 via the system bus to provide for the receipt of a chamber operator's inputs. The display unit provides information to a chamber operator in the form of graphical displays and alphanumeric characters under control of the CPU 220.

The control system bus provides for the transfer of data and control signals between all of the devices that are coupled to the control system bus. Although the control system bus is displayed as a single bus that directly connects the devices in the CPU 220, the control system bus can also be a collection of busses. For example, the display unit, input control unit (with input device), and mass storage device can be coupled to an input-output peripheral bus, while the CPU 220 and memory 210 are coupled to a local processor bus. The local processor bus and input-output peripheral bus are coupled together to form the control system bus.

The system controller 250 coupled to the elements of the gas panel 258 and the processing chamber 203, is employed in dielectric deposition processes in accordance with the present invention, via the system bus and the I/O circuits 240. The I/O circuits 240 receive instructions from the program 290 stored in the memory 210 via the CPU 220 and system bus. The program 290 provides program subroutines that enable the I/O circuits 240 to provide for substrate positioning control, process gas control, pressure control, heater control, and plasma control of the deposition system 200.

The CPU 220 forms a general purpose computer that becomes a specific purpose computer when executing programs such as the program 290. The program may execute embodiments of the method of the present invention depicted in the flow diagram of FIG. 4. Although the invention is described herein as being implemented in software and executed upon a general-purpose computer, those skilled in the art will realize that the invention could be implemented using hardware such as an application specific integrated circuit (ASIC) or other hardware circuitry. As such, it should be understood that the invention can be implemented, in whole or in part, in software, hardware or both.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively or lamp heated susceptor. The method for forming the dual layer low-K dielectric of the present invention is not limited to any specific apparatus or to any specific plasma excitation method.

Figure 3:
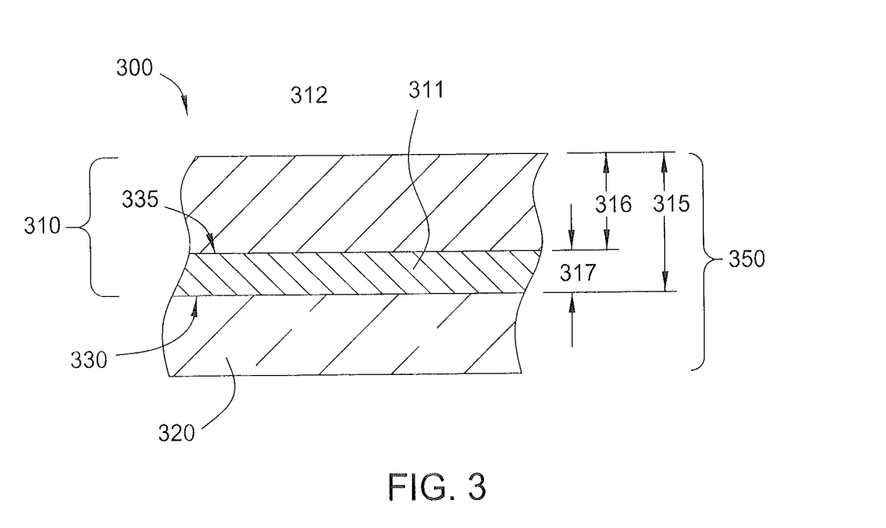
FIG. 3 is a schematic diagram of a film stack with a low-K dielectric layer deposited on a substrate, according to one embodiment of the present invention.

FIG. 3 is a schematic diagram 300 of a film stack 350 with a low-K dielectric layer 310 deposited on an underlying layer 320, according to one embodiment of the present invention. The low-K dielectric layer 310 includes a gradient layer 311 and a nano-porous bulk layer 312. The low-K dielectric layer 310 has a thickness 315, while gradient layer 311 has a thickness 317 and the nano-porous bulk layer 312 has a thickness 316. While undergoing a deposition process, gradient layer 311 is deposited from the bottom surface 330 up to the top surface 335 thereof. The low-K dielectric material has a K value <2.5 and in some instances, K~2.0.

The underlying layer 320 is not a thin film seed or transition layer specifically deposited in the film stack 350 for the purpose of strengthening the adhesive bond of the low-K dielectric layer 310. The underlying layer is a prior metal or dielectric layer that the film stack is grown on.

The transition layer 311 is an adhesive layer coupling the nano-porous bulk layer 312 to the underlying layer 320. The transition layer 311 is deposited from a process gas consisting of silicon (Si) precursor and carrier gas mixed with a carbon (C) precursor and a carrier gas. The carrier gas may be helium (He); nitrogen ($N_2$) or other gas which is non-reactive in the specific CVD reaction. In one embodiment He is used as a carrier gas for both the Si and C precursor. The process gas for generating the transition layer 311 has a flow range:

Si precursor between 100 and 5000 SCCM (15.4-909.1 SCCM/liter) with a carrier gas (He) between 500 and 5000 SCCM (76.9-909.1 SCCM/liter);

C precursor between 100 and 5000 SCCM (15.4-909.1 SCCM/liter) with a carrier gas (He) between 500 and 5000 SCCM (76.9-909.1 SCCM/liter), and oxidizing gas ($O_2$) between 0 and 5000 SCCM (0-909.1 SCCM/liter).

The preferred process gas flow range for the transition layer 311 is:

Si precursor between 200 and 1000 SCCM (30.8-181.8 SCCM/liter) with a carrier gas (He) between 2000 and 4000 SCCM (363.6-727.3 SCCM/liter);

C precursor between 200 and 1000 SCCM (30.8-181.8 SCCM/liter) with a carrier gas (He) between 200 and 1000 SCCM (30.8-181.8 SCCM/liter), and oxidizing gas ($O_2$) between 100 and 500 SCCM (15.4-90.9 SCCM/liter). These flow rates are given for a chamber having a volume of approximately 5.5 to 6.5 liters for deposition on a 300 mm wafer. The transition layer 311 is deposited to a thickness 317 of less than 40 Å.

The chamber is maintained at a pressure of about 1 to about 50 Torr during the deposition of the adhesive transition layer 311. The transition layer 311 may be cured to remove volatile constituents prior to deposition of a bulk layer 312. Curing can be performed in the chamber by providing a non-reactive gas environment, such as He or $N_2$, while heating the substrate to progressively higher temperatures. The temperature range may be from about 25° C. to about 400° C. to drive off remaining volatile products such as water. Processing conditions may be varied according to the desired characteristics of the deposited film. RF power between 50 and 1000 W at a frequency of about 13.56 MHz is applied to the showerhead during the deposition process for the transition layer 311. This results in a deposition rate for the transition layer 311 of between 500 and 10,000 Å/Min. In one embodiment, during the deposition of the transition layer 311, the flow rate is of both the Si precursor and the C precursor is modified, such that the carbon containing gas flow is increased with respect to the flow of the silicon containing gas, resulting in a gradual increase in the carbon content from a bottom surface 330 to a top surface 335 in the transition layer 311.

After the formation of transition layer 311, a nano-porous bulk layer 312 is disposed on the transition layer 311. As with the transition layer 311, the bulk layer 312 is deposited from a processing gas consisting of a silicon (Si) precursor and a carrier gas mixed with a carbon (C) precursor and a carrier gas. The carrier gas may be helium (He); nitrogen ($N_2$) or other non-reactive gas. In one embodiment He is used as a carrier gas for both the Si and C precursor. The process gas for generating the nano-porous bulk layer 312 has a flow rang:

Si precursor between 100 and 5000 SCCM (15.4-909.1 SCCM/liter) with a carrier gas (He) between 500 and 5000 SCCM (76.9-909.1 SCCM/liter);

C precursor between 100 and 5000 SCCM (15.4-909.1 SCCM/liter) with a carrier gas (He) between 500 and 5000 SCCM (76.9-909.1 SCCM/liter), and oxidizing gas ($O_2$) between 0 and 5000 SCCM (0-909.1 SCCM/liter).

The preferred process gas flow range for the nano-porous bulk layer 312 is:

Si precursor between 500 and 2000 SCCM (76.9-363.6 SCCM/liter); with a carrier gas (He) between 1000 and 3000 SCCM (153.8-545.5 SCCM/liter);

C precursor between 500 and 2000 SCCM (76.9-363.6 SCCM/liter); with a carrier gas (He) between 1000 and 3000 SCCM (153.8-545.5 SCCM/liter), and oxidizing gas ($O_2$) between 0 and 500 SCCM (0-90.9 SCCM/liter).

These flow rates are given for a chamber having a volume of approximately 5.5 to 6.5 liters for deposition on a 300 mm wafer. The nano-porous bulk layer 312 is deposited to a thickness 316 dependent on an application, such as, a dual-damascene process. Therefore the low-K dielectric layer 310 may have a thickness 315 of less than 50 Å.

The chamber is maintained at a pressure of about 1 to about 50 Torr during the deposition of the nano-porous bulk layer 312. The nano-porous bulk layer 312 may be cured to remove volatile constituents prior to deposition of subsequent layers. Curing can be performed in the chamber by providing a non-reactive gas environment, such as He or $N_2$, while heating the substrate to progressively higher temperatures in a range may be from about 25° C. to about 400° C. Processing conditions may be varied according to the desired characteristics of the deposited film. RF power between 50 and 1000 W at a frequency of about 13.56 MHz is applied to the showerhead during the deposition process for the nano-porous bulk layer 312. This results in a deposition rate for the nano-porous bulk layer 312 of between 500 and 10,000 Å/Min. The nano-porous bulk layer 312 thickness is dependent on the application/purpose. In one embodiment, during the deposition of the nano-porous bulk layer 312, flow rate are set as follows: the Si precursor is set at 2000 SCCM (363.6 SCCM/liter) with the carrier gas at 3000 SCCM (545.5 SCCM/liter); the C precursor is also set at 2000 SCCM (363.6 SCCM/liter) with its carrier gas at 3000 SCCM (545.5 SCCM/liter); and the $O_2$ flow is set to 500 SCCM (76.9 SCCM/liter).

Figure 4:
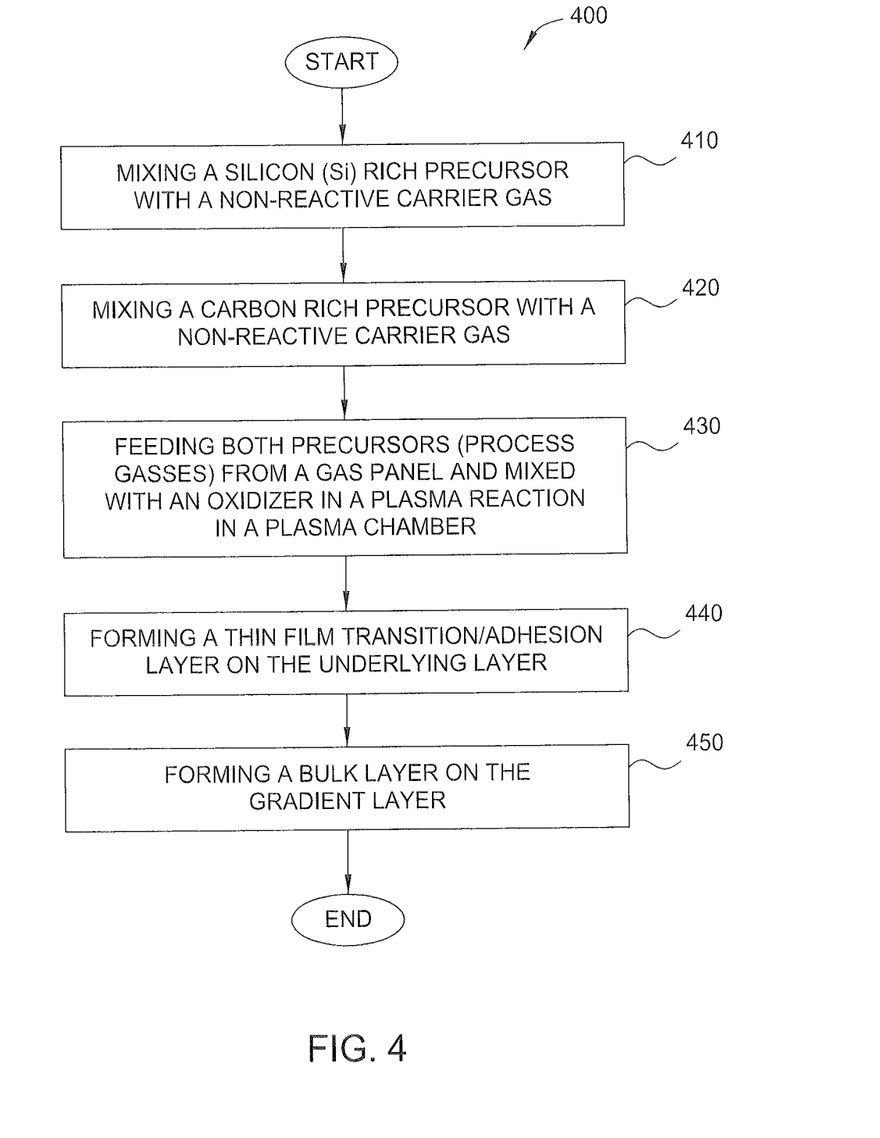
FIG. 4 is a flow diagram of a method for depositing a low-K dielectric layer, according to one embodiment of the present invention.

FIG. 4 is a flow diagram for a method of depositing a low-K dielectric layer, according to one embodiment of the present invention. In the method 400, a dual layer low-K dielectric is formed in a film stack suitable for a dual-damascene process.

At block 410, a silicon (Si) rich precursor is mixed with a non-reactive carrier gas. In one embodiment, the Si-rich precursor is methyldiethoxysilane (MDEOS). Again, an example of a non-reactive carrier gas may be helium or nitrogen. The mixing may occur at a ratio of 1:1 (Si to carrier gas) all the way to 1:5 (Si to carrier gas).

At block 420, a Carbon rich precursor is mixed with a non-reactive carrier gas. An example of a C-rich precursor may be alpha-terpinene (ATRP) or bicyclo[2.2.1]hepta-2,5-diene (BCHD). In one embodiment, ATRP is mixed at a gas panel with a non-reactive carrier gas such as nitrogen ($N_2$) or helium (He). The mixing may occur at a ratio of 1:1 (C to carrier gas) to 1:5 (C to carrier gas)

At block 430, both precursors (process gasses) are feed from a gas panel and mixed with an oxidizer in a plasma reaction in a process chamber. In one embodiment, during mixing of the process gasses with the oxidizer, a steady state flow of the Si-rich precursor and the C-rich precursor is maintained while portions of either precursor are diverted to bypass of the chamber. In an alternate embodiment, the mixing is performed by adjusting the SCCM of both the Si precursor and the C precursor. The mixing range for the oxidizer may vary from 20% Oxidizer (5000 SCCM (909.1 SCCM/liter)) all the way to a 0% Oxidizer (0 SCCM (0.0 SCCM/liter)) in the plasma gas.

At block 440, a thin film transition/adhesion layer is formed on the underlying layer. The underlying layer is not part of the adhesion layer. For instance, the underlying layer is not a thin film (<40 Å) seed or transition layer. The flow rates, and hence the concentrations of the precursors in the CVD chamber, are adjusted to produce gradually increasing carbon content in the transition layer. In one embodiment, and as shown in FIG. 3, the transition layer 311 is deposited at a thickness of less than 40 Å directly on the underlying layer 320.

At block 450, a bulk layer is formed on the transition layer. A constant silicon and carbon precursor is maintained during the deposition process. The thickness of the bulk layer is application specific. With the formation of the bulk layer, a dual layer low-K dielectric for a dual-damascene process is formed suitable. In one embodiment, the formation of the bulk layer is a discrete step from the deposition of the transition layer. Such an embodiment may entail an additional step of polishing the transition layer prior to the deposition of the bulk layer. However, in another embodiment, the transition and bulk layers are formed in a continuous deposition process.

In one exemplary embodiment in the formation of the transition layer, Si precursor MDEOS gas, C precursor ATRP gas, and the He carrier gas are mixed with oxidizer, ($O_2$) gas, for a plasma based reaction inside a plasma chamber while portions of the ATRP gas is diverted to a bypass. The concentration of ATRP gas is incremented in the plasma reaction in the plasma chamber until a defined concentration is reached. Thus ending the transition layer deposition at a thickness of less than 40 Å and beginning the nano-porous bulk layer deposition in a seamless manner.

The bulk layer is deposited to a application determined thickness of less than 10 Å. The transition layer and the nano-porous bulk layer form a dual layer low-K dielectric where K<2.5, the thickness is less than 50 Å, and the adhesive strength is 6.3 J/m². The formed dual layer low-K dielectric has the benefit if better adhesion strength than a conventionally formed 3 layer low-K dielectric. Additionally, as the process utilizes less process steps and materials, the process results in savings for raw materials and maintenance downtime of the CVD chambers.

While the foregoing is directed to the preferred embodiment of the present invention, other and further embodiments of the invention may be devised without departing from the basic scope thereof. The scope of the invention is determined by the claims which follow.

What is claimed is:

1. A film stack for use in a semiconductor device comprising:
   a dual layer low-K dielectric deposited directly on an underlying layer without the formation of an intervening layer, wherein the dual layer low-K dielectric has a thickness less than 50 Å, the dual layer low-K dielectric consisting of:
   an adhesion layer; and
   a bulk layer.

2. The film stack of claim 1 wherein the adhesion layer further comprises:
   a gradual increase in a carbon content.

3. The film stack of claim 1 wherein the adhesion layer and the bulk layer are formed in a continuous deposition process.

4. The film stack of claim 1 wherein the adhesion layer has a thickness less than 40 Å.

5. The film stack of claim 1 wherein at the surface of the adhesion layer formed on the underlying layer, there is a carbon content greater than 0% in the bottom surface of the adhesion layer.

6. The film stack of claim 1 wherein the bulk layer has a bulk layer thickness less than 10 Å.

7. The film stack of claim 1 wherein the dual layer low-K dielectric has a bond strength to the underlying layer of 6.3 J/m² or more.

8. The film stack of claim 1, wherein a methyldiethoxysilane (MDEOS) precursor is utilized to deposit the adhesion layer.

9. The film stack of claim 8, wherein an alpha-terpinene (ATRP) precursor is utilized to deposit the adhesion layer.

10. The film stack of claim 8, wherein helium (He) is used as a carrier gas to deposit the adhesion layer.

11. A method for depositing a nano-porous low-K dielectric layer directly on a film stack comprising:
    supplying a Si-rich precursor and a C-rich precursor to a deposition chamber;
    varying a mixture of the Si-rich precursor and the C-rich precursor gradually during a deposition of an adhesive layer on an underlying layer; and
    depositing a bulk layer on the adhesive layer with a fixed ratio of the Si-rich precursor and a C-rich precursor, wherein the nano-porous low-K dielectric layer has a thickness less than 50 Å.

12. The method of claim 11, wherein the nano-porous low-K dielectric layer is a dual damascene structure.

13. The method of claim 11 wherein the adhesive layer has an adhesive layer thickness of less than 40 Å.

14. The method of claim 11 wherein the Si-rich precursor is methyldiethoxysilane (MDEOS) and the C-rich precursor is alpha-terpinene (ATRP).

15. A non-transitory computer-readable storage medium storing code for execution by a central processing unit (CPU), wherein a code, when executed by a CPU, performs an operation for depositing a nano-porous low-K dielectric layer directly on a film stack comprising:
    supplying a Si-rich precursor and a C-rich precursor to a deposition chamber;

varying a mixture of the Si-rich precursor and the C-rich precursor gradually during a deposition of an adhesive layer on an underlying layer; and depositing a bulk layer on the adhesive layer while not changing the mixture, wherein the nano-porous low-K dielectric layer has a thickness less than 50 Å.

16. The non-transitory computer-readable storage medium claim 15, wherein the nano-porous low-K dielectric layer is a dual damascene structure.

17. The non-transitory computer-readable storage medium claim 15 wherein the adhesive layer has an adhesive layer thickness less than 40 Å.

18. The non-transitory computer-readable storage medium claim 15 wherein the Si-rich precursor is methyldiethoxysilane (MDEOS) and the C-rich precursor is alpha-terpinene (ATRP).

* * * * *